United States Patent [19]
Lakin

[11] Patent Number: 6,107,721
[45] Date of Patent: Aug. 22, 2000

[54] PIEZOELECTRIC RESONATORS ON A DIFFERENTIALLY OFFSET REFLECTOR

[75] Inventor: Kenneth Meade Lakin, Redmond, Oreg.

[73] Assignee: TFR Technologies, Inc., Bend, Oreg.

[21] Appl. No.: 09/361,645

[22] Filed: Jul. 27, 1999

[51] Int. Cl.[7] ................................................. H01L 41/08
[52] U.S. Cl. ................................. 310/321; 310/367
[58] Field of Search ............................ 310/320, 321, 310/340, 344, 345, 348, 357, 366, 367, 368

[56] References Cited

U.S. PATENT DOCUMENTS

| | | | |
|---|---|---|---|
| 3,414,832 | 12/1968 | Newell | 330/31 |
| 3,487,318 | 12/1969 | Herman | 329/117 |
| 4,211,947 | 7/1980 | Ikeno et al. | 310/312 |
| 5,373,268 | 12/1994 | Dworsky et al. | 333/187 |
| 5,892,318 | 4/1999 | Dai et al. | 310/358 |
| 5,894,647 | 4/1999 | Lakin | 29/25.35 |
| 5,962,955 | 10/1999 | Tsukuda et al. | 310/366 |
| 5,969,463 | 10/1999 | Tomita et al. | 310/320 |

*Primary Examiner*—Nestor Ramirez
*Assistant Examiner*—Eliza Stefaniw
*Attorney, Agent, or Firm*—G. Joseph Buck

[57] ABSTRACT

Piezoelectric resonators utilizing a differentially offset reflector. One or more piezoelectric resonators are supported upon a substrate by one or more intervening layers of material, which intervening layers of material act as a reflector. The reflector isolates the resonators from the substrate. A portion of one or more of the intervening layers of material includes a differential layer of material, which differential layer shifts the resonant frequencies of the resonators that overlie the differential layer as compared with the resonant frequencies of those resonators that do not overlie the differential layer of material.

2 Claims, 4 Drawing Sheets

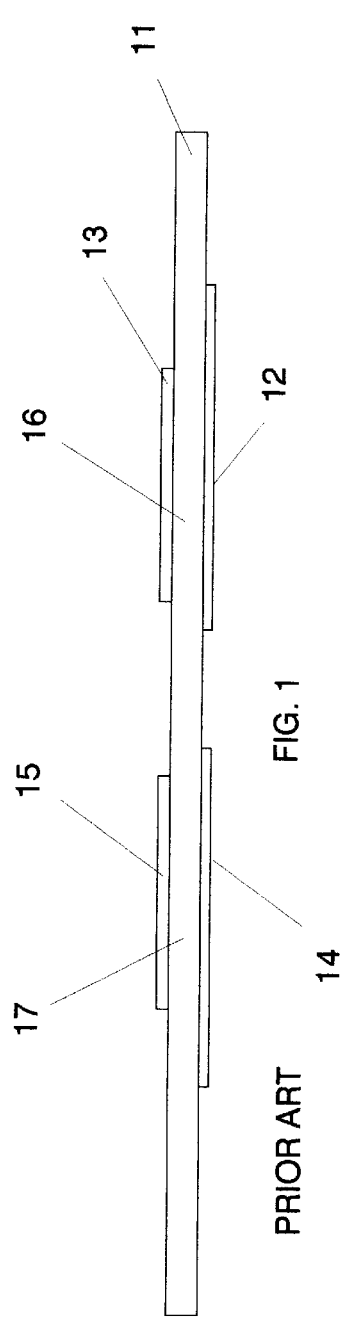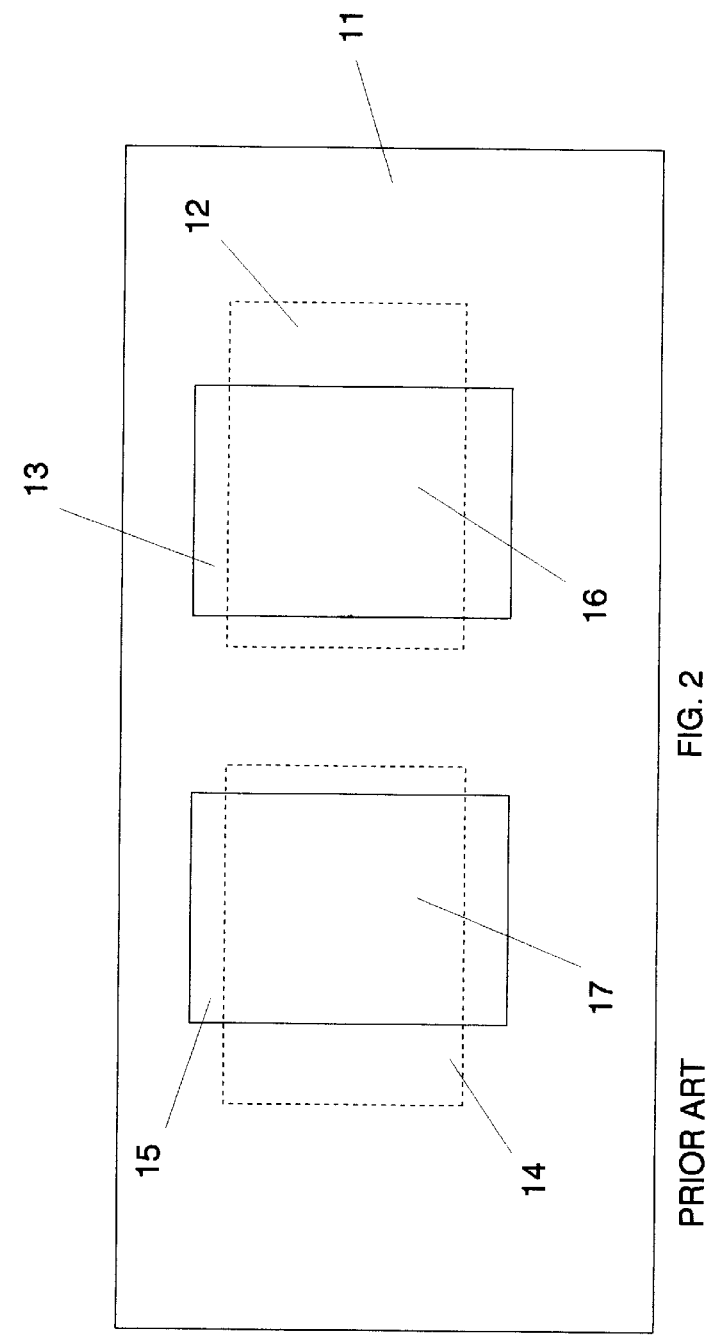

PIEZOELECTRIC RESONATORS ON A DIFFERENTIALLY OFFSET REFLECTOR

1. BACKGROUND OF THE INVENTION a. Field of the Invention

This invention pertains to the fabrication of piezoelectric resonators which resonate at microwave frequencies. More particularly this invention pertains to the fabrication of multiple resonators on a single substrate, where the resonant frequency of one or more resonators is shifted by a small amount relative to the resonant frequency of one or more of the other resonators on the same substrate.

b. Description of the Prior Art

The fabrication of one or more piezoelectric resonators for use at microwave frequencies by the deposition of metal electrodes upon a piezoelectric substrate is well known in the art. FIGS. 1 and 2 depict a piezoelectric substrate 11 upon which conducting metal electrodes 12, 13, 14 and 15 have been deposited. The electrodes, together with the piezoelectric material that is sandwiched between the overlapping portions of the electrodes form piezoelectric, bulk-wave resonators 16 and 17. Although FIGS. 1 and 2 depict only two resonators, many resonators can be fabricated at one time upon a single wafer. Such devices and fabrication techniques are described in "High-Q Microwave Acoustic Resonators and Filters," by Lakin, Kline and McCarron, IEEE Trans. on Microwave Theory and Techniques, Vo. 41, No. 12, December 1993, p. 2139; Guttwein, Ballato and Lukaszek, U.S. Pat. No. 3,694,677; and "Acoustic Bulk Wave Composite Resonators", Applied Physics Letters 38(3) by Lakin and Wang, Feb. 1, 1981.

U.S. Pat. No. 5,894,647 describes prior art methods for fabricating two or more piezoelectric resonators on a substrate such that the resonant frequency of one resonator is shifted by a small amount from the resonant frequency of other resonators. The prior art methods include the fabrication of a slightly thicker electrode that forms part of a first resonator as compared to the thickness of a similar electrode forming part of a second resonator on the same substrate. The difference in the thicknesses of the electrodes shifts the resonant frequency of the first resonator relative to the resonant frequency of the second resonator.

In a first method of the prior art, the difference in the thicknesses of the two electrodes is obtained by depositing the metal for the two electrodes in two, separate steps, e.g. electrode 15 of FIGS. 1 and 2 is deposited in one step in the fabrication process and electrode 13 is deposited in a different step in the process. However, when the two electrodes, having different thicknesses, are fabricated in two separate steps, it is difficult to control the depositions such that the electrode thicknesses will differ by only a small, controlled amount.

In a second method, the metal for both electrodes 13 and 15 are deposited in a single operation and then a thin, differential layer of metal is added by depositing a second, differential layer of metal upon electrode 15. Because the differential layer is deposited separately, the difference in the thicknesses of the two electrodes can be carefully controlled. As described in U.S. Pat. No. 5,894,647 ("647"), slight misalignments of the mask that is used to spatially define the differential layer often produce an electrode having a narrow strip of metal along one or more edges that does not have the thickness of the original layer of metal plus the differential layer, but, instead, has the thickness of only the original layer of metal or has the thickness of the differential layer alone. These narrow strips of metal produce parasitic resonators that degrade the operation of the basic resonator. The "647" patent discloses a method for trimming the edges of the electrodes so as to remove variations in electrode thickness that cause such degradation.

In a different, but related area of the prior art, U.S., Pat. Nos. 3,414,832, 5,373,268 and 5,821,833 disclose resonators which are fabricated upon, and mechanically supported by, a substrate comprising a number of layers of different materials. See also "Solidly Mounted Resonators and Filters", 1995 IEEE Proc. Ultrasonics Symposium, pp. 905–908 and U.S. Pat. Nos. 5,821,833, 5,373,268 and 3,414, 832. FIG. 3 depicts such a resonator of the prior art. Resonator 20, which is formed by piezoelectric layer 21 and electrodes 22 and 23, is mechanically supported on substrate 24 by means of a series of intervening layers 25 through 29 of material. As viewed normal to the surfaces of layers 25 thru 29, the area that is common to both electrodes 22 and 23, i.e. the are of overlap, defines the approximate active region of piezoelectric layer 21, which together with electrodes 22 and 23, acts as resonator 20.

Intervening layers 25, 26, 27, 28, and 29 have mechanical properties which alternate from one layer to the next and, at the microwave frequency of interest, each intervening layer has a thickness that is approximately equal to a quarter wave-length of a thickness-mode wave propagating through the layer or an odd integral multiple thereof. By selecting the mechanical properties and thickness of each layer, and the number of layers, one can control the mechanical impedance with respect to thickness-mode vibrations that the uppermost surface 30 of the intervening layers presents to resonator 20, e.g. a very low impedance that approximates suspension of resonator 20 in free space, or a very high impedance that approximates a clamped or rigid surface. For a clamped surface, i.e. when surface 30 provides a high mechanical impedance, resonator 20 exhibits a resonance when substrate 21 is approximately one-quarter wave in thickness, and for a free surface, i.e. when surface 30 provides a low mechanical impedance, resonator 20 exhibits a resonance when substrate 21 is approximately one-half wavelength in thickness.

Although five intervening layers 25 through 29 are depicted, larger and smaller numbers of layers have been used in the prior art. The intervening layers 25 thru 29 are collectively referred to herein as an acoustic reflector, or simply a reflector, and the surface of the reflector can be characterized as having a coefficient of reflection for impinging acoustic waves. As one example of the prior art, layer 21 is a 3 micrometer-thick layer of piezoelectric aluminum nitride, electrodes 22 and 23 are 3000 Angstrom thick layers of aluminum, substrate 24 is sapphire, and the intervening layers of materials 25 thru 29 are alternating layers of silicon dioxide and aluminum nitride having thicknesses of 0.7 and 1.8 micrometers respectively. The aluminum nitride in the intervening layers is normally fabricated so as not to be piezoelectric. Although FIG. 5 depicts five intervening layers, the prior art device referred to above uses nine alternating layers of silicon dioxide and aluminum nitride to obtain the desired coefficient of reflection at the surface of the reflector. The resonant frequency of the resonator(s) is approximately 1,600 MHz. U.S. Pat. No. 5,821,833 further describes the analysis and design of such reflectors.

2. SUMMARY OF THE INVENTION

The present invention fabricates a plurality of resonators upon a single substrate, which resonators are supported upon the substrate by one or more intervening layers of material. The resonant frequencies of one or more of the resonators is shifted relative to the resonant frequencies of other resonators by slightly altering the thickness of one of the intervening layers. The thickness need only be altered on that portion of the intervening layer that underlies those resonators whose resonant frequencies are to be shifted relative to the resonant frequencies of those resonators under which the thickness of the intervening layer has not been altered.

3. BRIEF DESCRIPTION OF THE DRAWINGS

FIGS. 1 and 2 depict a piezoelectric resonator of the prior art.

4. DETAILED DESCRIPTION

Figure 3:
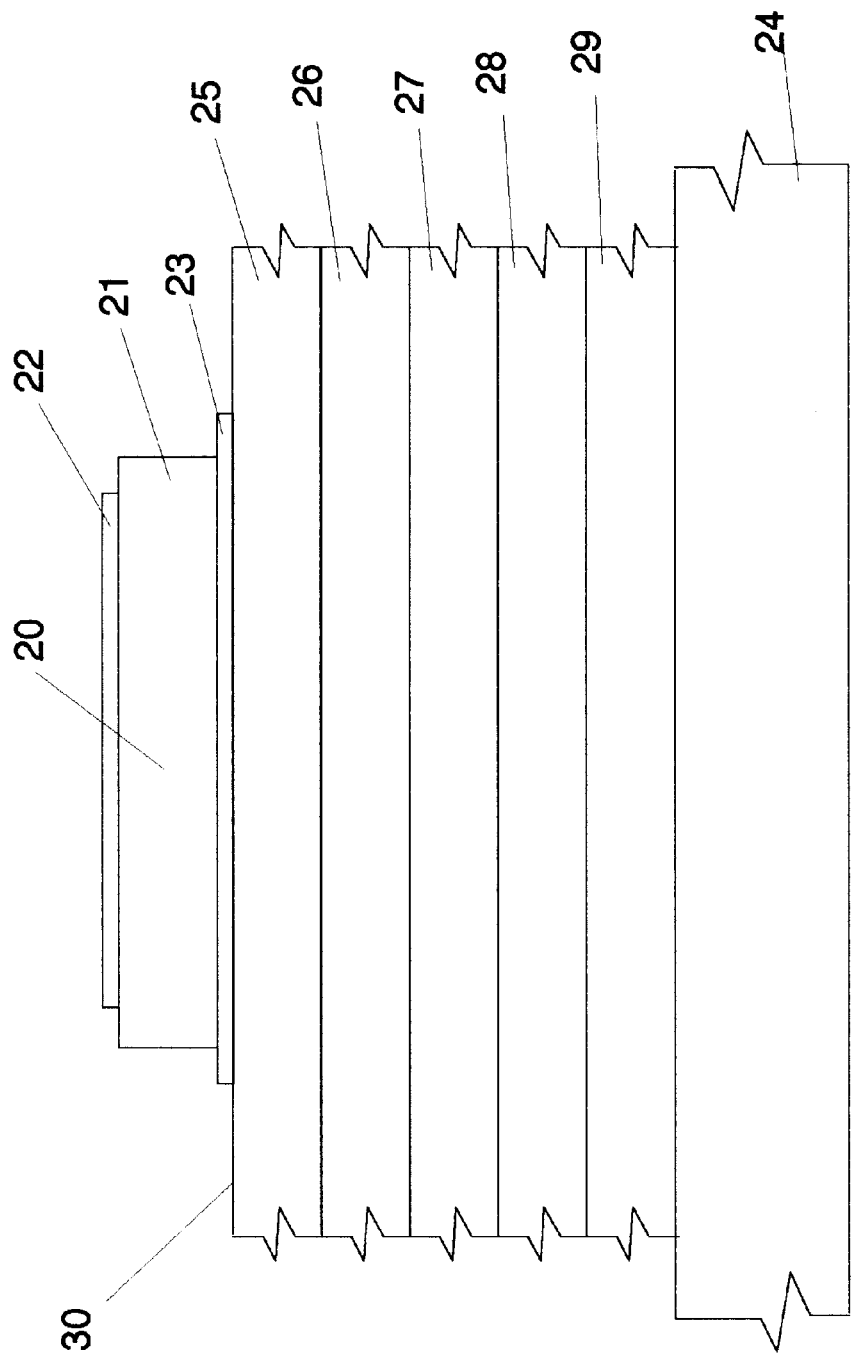
FIG. 3 depicts a piezoelectric resonator of the prior art that is supported upon a substrate by a number of intervening layers of material that act as a reflector.
Figure 4:
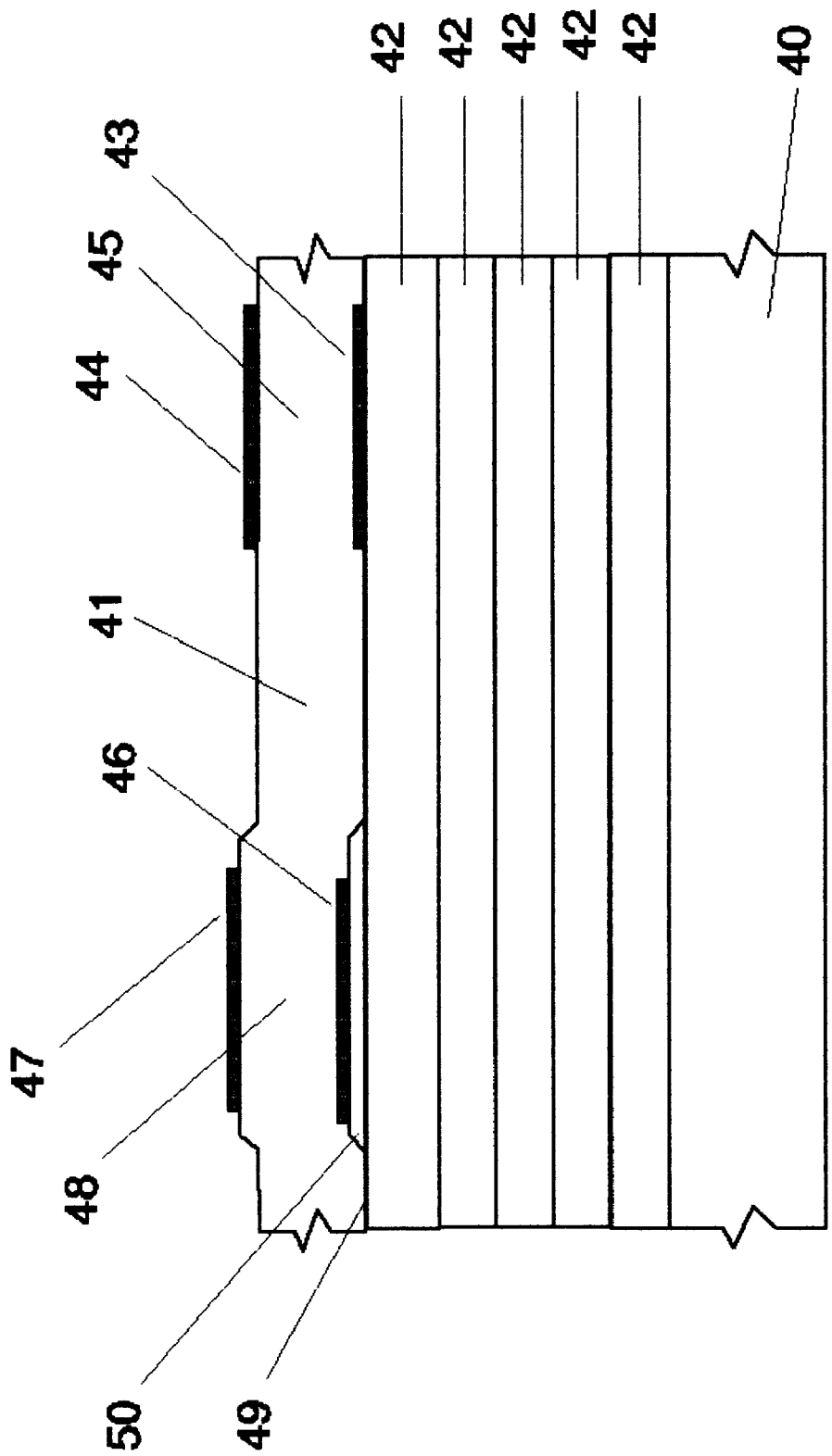
FIG. 4 depicts a first embodiment of the invention.

Referring now to FIG. 4, a layer 41 of piezoelectric material is supported on substrate 40 by one or more intervening layers 42 of material. Conducting metal electrodes 43 and 44, together with the portion of piezoelectric layer 41 that is sandwiched between these two electrodes comprise resonator 45. Similarly, electrodes 46 and 47, together with the portion of piezoelectric layer 41 that is sandwiched between them comprise resonator 48. Resonators 45 and 48 and piezoelectric layer 41 are supported upon substrate 40 by intervening layers 42. In a similar manner to that described above, the mechanical properties and thicknesses of the intervening layers are selected so as to obtain a reflector surface 49 that provides either a high or low mechanical impedance to acoustic waves propagating normally to these layers.

As depicted in FIG. 4, in the present invention an additional, thin, differential layer 50 of material is added to the uppermost intervening layer of material over those portions of the intervening layer that underlies the resonators whose resonant frequencies are to be shifted, e.g. underlying resonator 48. The addition of the differential layer of supporting material alters the mechanical impedance that the reflector surface 49 provides to resonator 48. As a consequence, the resonant frequency of resonator 48 is shifted by a small amount.

Typically, the bandwidth of the reflection coefficient substantially exceeds the bandwidth of the resonators that it supports. The phase of the reflection coefficient at the surface of the reflector depends upon the reflections of the acoustic waves from the underlying layers. This dependence, however, decreases with respect to lower layers that are further removed from the surface of the reflector. For methods of analysis and further descriptions of reflectors and resonators see Lakin, "Solidly Mounted Resonators and Filters", 1995 IEEE Proc. Ultrasonics Symposium, pp. 905–908 and Lakin et al. "Development of Miniature Filters for Wireless Applications", IEEE Trans. on Microwave Theory and Techniques, Vol. 43, No. 12, December 1996, pp. 2933–2939.

Figure 5:
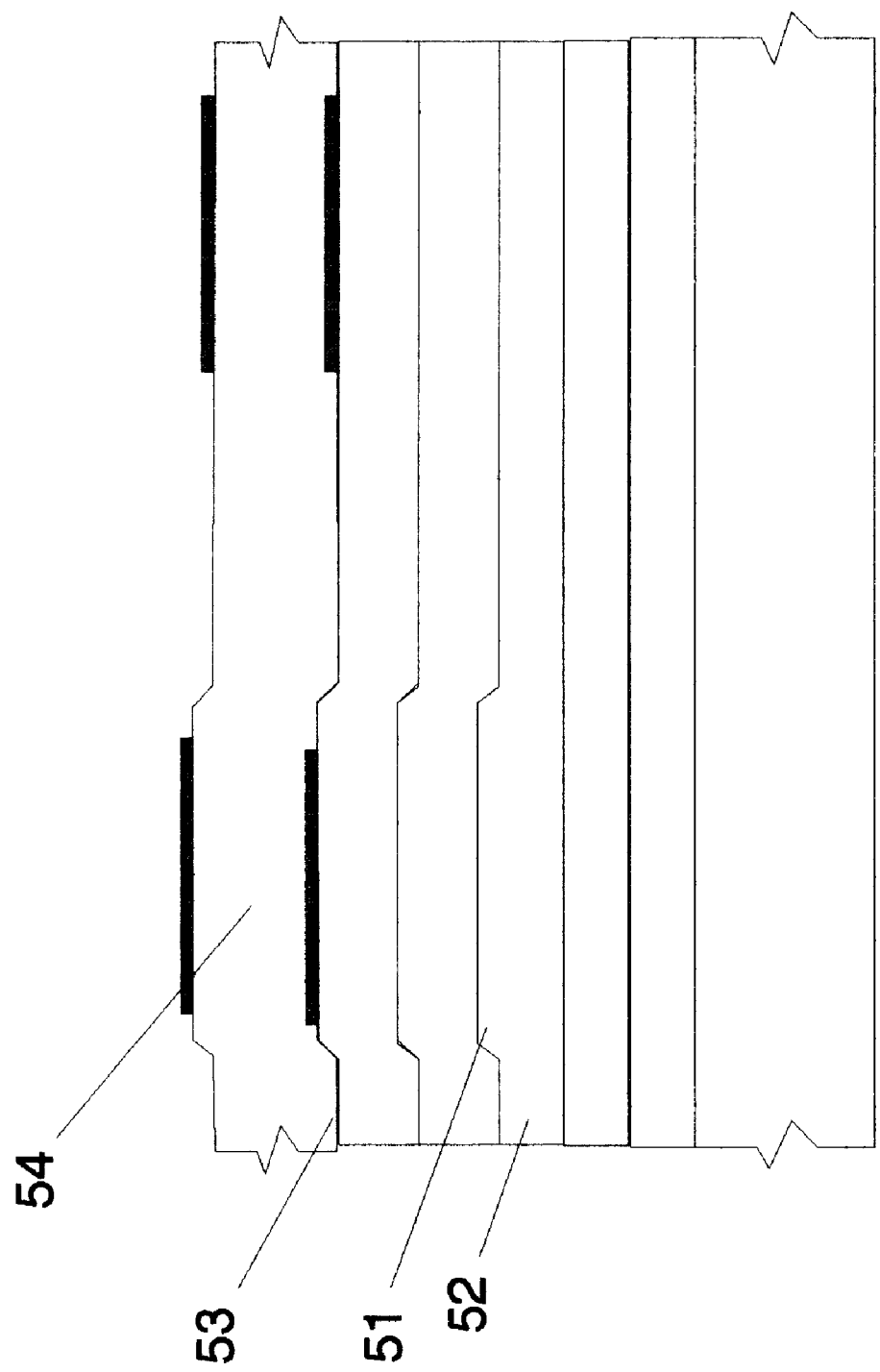
FIG. 5 depicts a second embodiment of the invention.

The differential thickness of the underlying layer of material that must be added to shift the resonant frequency of the overlying resonator is much greater than the thickness of metal that otherwise would have had to be added to a resonator electrode to obtain the same shift. The differential layer of supporting material need not necessarily be added to the uppermost layer of the reflector but as depicted in FIG. 5, the differential layer 51 could, instead, be added to an underlying layer, e.g. layer 52 so as to effect a change in the reflection coefficient exhibited by the reflector at surface 53. The configuration depicted in FIG. 5 is similar to that depicted in FIG. 4 except for the location of the differential layer. Because layer 52 is more distant from surface 53, the change in the reflection coefficient due to a given thickness of differential layer 51 is diminished. Thus, to obtain the same shift in the resonant frequency of the overlying resonator 54, a greater differential thicknesses must be added when the layer of material to which the differential thickness is added is further removed from the reflector surface. As a consequence, for a given shift in resonant frequency, the dimensional accuracy required for the thickness of the differential layer is less when the location of the differential layer is more remote from the surface of the reflector. Although the word "differential" is used, it should be understood that, particularly with differential layers that are separated by a number of intervening layers from the reflector surface, the thickness of the differential layer may be sustantial fraction of the thicknesses of the overlaying layers.

An important advantage of this invention is that the thickness of the differential layer of supporting material need not be controlled nearly as accurately as the thickness of a differential layer of metal that would have been added to the electrode to cause the same shift in resonant frequency for the resonator. For example, for a resonant frequency of 3,500 MHz, 50 angstroms of aluminum added to the electrode will cause about the same shift in resonant frequency as adding approximately 1400 angstroms of silicon dioxide to the third layer of material below the surface of the resonator.

The differential layers that are depicted in FIGS. 4 an 5 normally consist of a material that is the same as the layer of material upon which the differential layer is deposited or that has acoustic properties that are approximately the same as the properties of the layer of material upon which the differential material deposited. In practice, however, because of the suseptibility of some materials to various etchants used in the masking and deposition process, it is often simpler and easier to deposit the differential layer of material underneath the layer of similar material instead of on top of the layer of similar material. In either case, the presence of the differential layer of material shifts the resonant frequency of the overlying resonators.

Although FIGS. 4 and 5 each depict the addition of only a single layer of differential material, it should be understood that differential layers of material can be added to more than one of the underlying layers of material. Furthermore, over one area of wafer, a differential layer of material may be added to one layer of underlying material, and over a different area of the wafer, a differential layer of material may be added instead to a different layer of underlying material.

The present invention thus provides a means for fabricating a substantial number of resonators upon a single wafer wherein the resonant frequencies of one set of the resonators can be shifted relative to the remaining resonators on the wafer by adding a differential thickness to that portion of an underlying, intervening layer that underlies the set of resonators whose frequencies are to be shifted. Multiple sets of resonators, having differing resonant frequencies also can be fabricated upon one wafer by underlying the various sets with different, differential layers of intervening material having appropriate differential thicknesses. The invention can thus provide resonators having differing resonant frequencies, which resonators can be combined to provide desirable filtering characteristics.

The invention also provides a method for fabricating upon a single wafer, different sets of resonators, each set of resonators having a specific resonant frequency. The different sets can be fabricated in one operation and then be cut from the it wafer for use in particular different applications, thus reducing the cost of fabricating such resonators.

I claim:

1. A piezoelectric resonator device supported upon a substrate, the resonator device having a shifted resonant frequency, comprising:

a substrate, a piezoelectric resonator, a reflector comprising at least one intervening layer of material, the reflector intervening between the resonator and the substrate and the reflector supporting the resonator upon the substrate, the intervening layer of material located immediately adjacent to the resonator being substantially non-conductive, one intervening layer of material including a differential layer of material, whereby the differential layer of material shifts the resonant frequency of the piezoelectric resonator device.

2. A combination of piezoelectric resonators supported upon a substrate comprising:

a substrate, a first piezoelectric resonator having a resonant frequency, a second piezoelectric resonator having a resonant frequency, a reflector comprising at least one intervening layer of material, the reflector intervening between the first piezoelectric resonator and the substrate, and the reflector intervening between the second piezoelectric resonator and the substrate, and the reflector supporting the first and second piezoelectric resonators upon the substrate, the intervening layer of material located immediately adjacent to the resonator being substantially non-conductive, a portion of one intervening layer of material including a differential layer of material, said portion intervening between the first piezoelectric resonator and the substrate and said portion not intervening between the second piezoelectric resonator and the substrate, whereby the resonant frequency of the first piezoelectric resonator is shifted relative to the resonant frequency of the second piezoelectric resonator.

* * * * *